United States Patent [19]

Vossen, Jr.

[11] 4,372,806

[45] Feb. 8, 1983

[54] PLASMA ETCHING TECHNIQUE

[75] Inventor: John L. Vossen, Jr., Bridgewater, N.J.

[73] Assignee: RCA Corporation, New York, N.Y.

[21] Appl. No.: 335,851

[22] Filed: Dec. 30, 1981

[51] Int. Cl.$^3$ ............................................... C23F 1/02
[52] U.S. Cl. ................................. 156/643; 156/646; 156/656; 156/659.1; 156/665; 204/192 E; 252/79.1
[58] Field of Search ............... 156/643, 646, 656, 665, 156/659.1; 252/79.1; 204/164, 192 E, 298; 427/38, 39

[56] References Cited

U.S. PATENT DOCUMENTS 4,148,705  4/1979  Battey et al. ................... 156/643 X
4,256,534  3/1981  Levinstein .......................... 156/643

OTHER PUBLICATIONS

Winkler et al., "The Role of Air Locks During Aluminum Plasma Etching," paper given at SEMI European Symposium on Materials and Processing, Zurich, Mar. 11-13, 1980.

*Primary Examiner*—William A. Powell
*Attorney, Agent, or Firm*—Birgit E. Morris; R. Hain Swope

[57] ABSTRACT

A method of improving the variable induction time encountered in the plasma etching of aluminum and similar metals comprising pretreatment by hydrogen glow discharge.

4 Claims, No Drawings

PLASMA ETCHING TECHNIQUE

This invention pertains to the plasma etching of aluminum, certain other metals and their alloys.

BACKGROUND OF THE INVENTION

The importance of etching aluminum and aluminum alloys has increased significantly within the last several years. As the electronics industry has moved into production of very large scale integrated circuits (VLSI), the need to find a method of etching aluminum which meets the requirements for VLSI production has likewise grown in importance.

One of the critical problems which must be solved in order to etch aluminum efficiently is the variance in onset of etching, i.e. the induction period, when aluminum or its alloys are etched in chlorinated gases. The variable induction period in aluminum etching leads to non-reproducible etch times from run-to-run, a decided disadvantage in a production situation. Further, variance in induction period expands process time and reduces throughput, likewise disadvantageous. A simple yet effective solution to this problem is provided in accordance with this invention.

BRIEF SUMMARY OF THE INVENTION

A method of substantially reducing variable induction period in aluminum plasma etching is provided which comprises utilizing a short hydrogen glow discharge pretreatment prior to the introduction of the etching gas.

DETAILED DESCRIPTION OF THE INVENTION

The problem of variable induction period encountered in the plasma etching of aluminum or its alloys with chlorinated gases is due to residual water vapor in the reaction chamber. The water vapor may be absorbed on surfaces in the vacuum system and/or chemisorbed on molecules remaining in the system from a prior etch run. The problem is particularly acute in "batch" production systems wherein the process chamber is vented to atmospheric pressure between etching operations.

When the etch gas is introduced into the reactor and the plasma initiated, the bombardment of surfaces by electrons and ions desorbs the water which is broken down to hydrogen and oxygen. The oxygen immediately reacts with the aluminum substrate to form aluminum oxide. The amount of oxidation which occurs will depend on how much water vapor is present and the glow discharge conditions.

The formation of aluminum oxide is a problem in maintaining a stable induction period from one run to another run because the etch rate of aluminum oxide is considerably slower than that of aluminum or its alloys. In actuality, aluminum oxide is probably removed more by physical bombardment than by chemical reaction. The amount of oxide which forms can cause the induction time to vary considerably and adversely affect reproducibility of etch time run-to-run, a major problem in production operations.

The adverse effect of the formation of the layer of aluminum oxide may be, to an extent, negated by an adequate end-point detection system. However, when certain etch gases, for example carbon tetrachloride, are used, optical end-point detection is very difficult due to interferences between the spectrum of carbon tetrachloride and that of certain of the etch products.

When surfaces of a substrate perpendicular to the direction of the etch become completely etched, the flow of volatile etch products removed from the reactor drops significantly. Etching of substrate surfaces which are parallel or nearly parallel to the direction of the etch takes place at a slower rate. Therefore, it becomes difficult to determine when etching of such surfaces is completed. For this reason, etching is usually extended beyond the end-point as determined by the detection system. It will be readily appreciated that the presence of an oxide layer on such parallel surfaces will, of necessity, require that process time be materially extended to assure its removal. It can be seen, therefore, that prevention of the formation of the aluminum oxide layer is of significant advantage, particularly in the production of VLSI devices.

A number of authors have addressed the problem of variable induction period in aluminum etching. There are two basic approaches to solving the problem disclosed; the first is the use of a vacuum load-lock to maintain the process chamber continuously under vacuum. Load-lock is disadvantageous, however, in that it greatly complicates the mechanical aspects of the process equipment utilized and usually leads to greater maintenance frequency. A second proposed solution to the problem is enclosing the vacuum chamber in a dry glove box. The use of a glove box is disadvantageous in that it makes loading and unloading of substrates awkward and difficult resulting in excessively long cycle times. More important, however, is the fact that neither of these proposed remedies is effective in removing water from the surface of the substrate or from the carrier utilized to insert the substrate into the vacuum chamber. Thus, neither remedy effectively eliminates the variable induction period.

In accordance with this invention, there is provided an effective means of substantially eliminating the variable induction period in aluminum etching conveniently and without utilizing additional apparatus. The method of this invention utilizes a short glow discharge treatment in hydrogen prior to introduction of the etch gas. Extensive experimentation with the method of this invention utilizing a wide variety of operating conditions and etch gases has consistently demonstrated a stable inductive period of $30\pm10$ seconds. The remarkable consistency of induction period achieved in accordance with this invention is particularly advantageous from a production point of view.

The method of this invention can be carried out in any conventional plasma etchng apparatus. Particularly preferred are parallel plate reactors such as described by Vossen in an article entitled, "Plasma Deposition and Etching Reactors for Semiconductor Applications" in Pure and Appl. Chem., Vol. 52, pp. 1759–1765 (1980). Preferably, for the plasma etching of aluminum, all inside surfaces of the reaction chamber of such reactors are coated with plasma sprayed aluminum oxide to prevent etching of the reactor electrodes and walls. Because this is a somewhat porous material, there is a very large surface area onto which water can be absorbed. The method of this invention becomes even more important when such a coating is utilized.

The conditions for the hydrogen glow discharge in accordance with this invention are not particularly critical. Preferably, in a parallel plate reactor such as described in the above-mentioned Vossen article, a hydrogen inlet flow of 90 standard cc/min. at 500 mtorr pressure and 500 watts is utilized for about 5 minutes. Those skilled in the art will realize that these parameters can be varied rather widely without departing from the scope of this invention. For example, the time of the glow discharge may be shortened by utilizing higher power levels and/or lower pressure, both of which increase bombardment of all surfaces by hydrogen ions. Lower power, preferably not below about 100 watts, and/or higher pressure will require a longer time to stabilize the surfaces of the reactor and contents. The inlet flow is likewise not critical down to about 5 standard cc/min. The upper limit is determined by the vacuum pump capacity of the system. The upper limit on the other parameters is likewise determined by the capacity of the apparatus being utilized.

Although the exact mechanism by which the hydrogen glow discharge removes moisture from the reactor in accordance with this invention is not known, it is believed that the water is caused to disassociate to oxygen and hydrogen which are then pumped out of the system. It is possible to detect the point at which most of the moisture has been removed by taking a voltage reading on the system. As oxygen is pumped out of the system, the voltage will gradually decline until a stable level is reached indicating most of the oxygen has been removed. The glow discharge is continued for a reasonable time beyond this point to assure that all moisture is removed.

The method of the present invention has been described with reference to etching of aluminum. It is, however, equally applicable to the etching of any metal or alloy thereof which forms a passivating oxide at ambient temperature in the presence of moisture under plasma discharge. Examples of such metals include titanium, tantalum, niobium, hafnium, vanadium, zirconium, molybdenum, tungsten and their alloys. The method of this invention has likewise proved effective in the etching of aluminum with all etch gases tested individually and in various combinations, e.g. chlorine, boron trichloride, carbon tetrachloride and the like.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

A series of 1 millimicron thick aluminum coated silicon wafers was utilized as substrates. The wafers were overcoated with a finely patterned resist layer. The wafers were placed in groups of two into a parallel electrode etching reactor. All surfaces inside the reactor chamber had a coating of plasma-sprayed aluminum oxide. The upper electrode was rf powered and the lower (substrate) electrode was tuned to produce a voltage to ground of 238 volts. The upper electrode power was one kW and the pressure during etching was 250 mtorr. The total gas flow averaged about 60 sccm. Etching was carried out using a 95:5 partial pressure mixture of boron trichloride and chlorine.

In each etching run, the induction period, i.e. the period until onset of etching of the aluminum, was determined by an end point detection system which records the spectral line of end products such as aluminum chloride. A sharp increase in the signal for such product was utilized as an indication of onset of etching. In each instance, etching was carried out for 6 minutes after onset of etching. The reactor was vented at the end of each run to allow removal of the substrates.

In alternate etching runs, a hydrogen glow discharge pretreatment was carried out utilizing a hydrogen inlet flow of 90 sccm at a pressure of 500 mtorr. The hydrogen glow discharge pretreatment was carried out for 5 minutes at an upper electrode power level of 500 watts. With the exception of the pretreatment, the procedures followed in each run were the same. For a total of 20 runs, the induction period without benefit of the pretreatment was $120 \pm 60$ seconds, when hydrogen glow discharge pretreatment was utilized, the induction period was $30 \pm 10$ seconds.

EXAMPLE 2

A similar experiment as in Example 1 was conducted utilizing carbon tetrachloride as the etching gas. For a total of ten runs without pretreatment, the induction period was $120 \pm 60$ seconds. Under the same conditions but including the hydrogen pretreatment, the induction period was $30 \pm 10$ seconds. The significant advantage of the pretreatment of this invention is demonstrated by the above results.

I claim:

1. In a process of plasma etching a metal or an alloy thereof which, in the presence of moisture, will form a passivating oxide at room temperature under plasma discharge, the improvement comprising pretreating said metal or alloy with a hydrogen glow discharge.

2. A process in accordance with claim 1, wherein said metal is aluminum.

3. A process in accordance with claim 2 wherein said plasma is carbon tetrachloride.

4. A process in accordance with claim 2 wherein said plasma is a mixture of boron trichloride and chlorine.

* * * * *